United States Patent [19]
Hosoi et al.

[11] 3,953,408
[45] Apr. 27, 1976

[54] ADDITION POLYMERIZABLE POLYMERIC COMPOUNDS

[75] Inventors: Keizo Hosoi, Tokyo; Hiroshi Sagami, Shiki; Isao Imai, Niiza, all of Japan

[73] Assignee: Asahi Kasei Kogyo Kabushiki Kaisha, Osaka, Japan

[22] Filed: Oct. 18, 1973

[21] Appl. No.: 407,704

Related U.S. Application Data

[62] Division of Ser. No. 208,690, Dec. 16, 1971, Pat. No. 3,796,578.

[30] Foreign Application Priority Data

Dec. 26, 1970 Japan............................... 45-128473
Mar. 6, 1971 Japan................................ 46-11702
Mar. 6, 1971 Japan................................ 46-11703
Mar. 17, 1971 Japan............................... 46-14385

[52] U.S. Cl................................ 260/836; 260/861; 260/867; 260/873; 260/901; 526/15; 526/16; 526/55; 526/273; 526/320; 526/324; 526/325; 526/329; 526/330; 526/342; 526/347
[51] Int. Cl.² ................ C08F 212/08; C08F 220/06
[58] Field of Search ................. 260/78.5 R, 78.5 T, 260/80.8, 80.81, 80 P

[56] References Cited
UNITED STATES PATENTS 3,448,089  6/1969  Celeste ............................ 260/78.5
3,616,364  10/1971  D'Alelio........................ 204/159.14

FOREIGN PATENTS OR APPLICATIONS 648,527  9/1962  Canada............................ 260/78.5

Primary Examiner—John Kight, III
Attorney, Agent, or Firm—Burgess, Dinklage & Sprung

[57] ABSTRACT

Addition polymerizable polymeric compounds produced by esterification reaction or addition reaction of a copolymer having pendent carboxyl groups and about 0.03 to 1.0 equivalent, based upon the carboxyl groups of said copolymer, of an ethylenically unsaturated compound having one oxirane ring, said copolymer being obtained by copolymerizing (1) about 10 to 95 percent by weight of at least one member selected from the group consisting of styrene and the methyl-substituted styrene derivatives (2) about 5 to 70 percent by weight of at least one ethylenically unsaturated mono- or di-carboxylic acid, its anhydride or its monoalkyl of 1 to 4 carbon atoms ester, (3) up to about 30 percent weight of at least one member selected from the group consisting of acrylonitrile and methacrylonitrile, (4) up to about 85 percent by weight of at least one compound of the formula

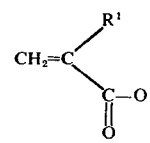

wherein $R^1$ represents a hydrogen atom or methyl group; and $R^2$ represents an alkyl group having 1 to 12 carbon atoms, and (5) up to about 50 percent by weight, based upon the total weight of said compound (3) and/or (4), of at least one vinyl ester of a saturated aliphatic mono-carboxylic acid having 2 to 10 carbon atoms, and photopolymerizable compositions comprising (A) about 100 parts by weight of the above-described addition polymerizable polymeric compound, (B) about 5 to 70 parts by weight of at least one ethylenically unsaturated compound and (C) about 0.0001 to 10 parts by weight of a photopolymerization initiator.

The compositions give photopolymerizable elements which are useful for various pattern or image yielding purposes and especially useful in making reliefs, particularly lithographic plates having an excellent printing durability.

8 Claims, 1 Drawing Figure

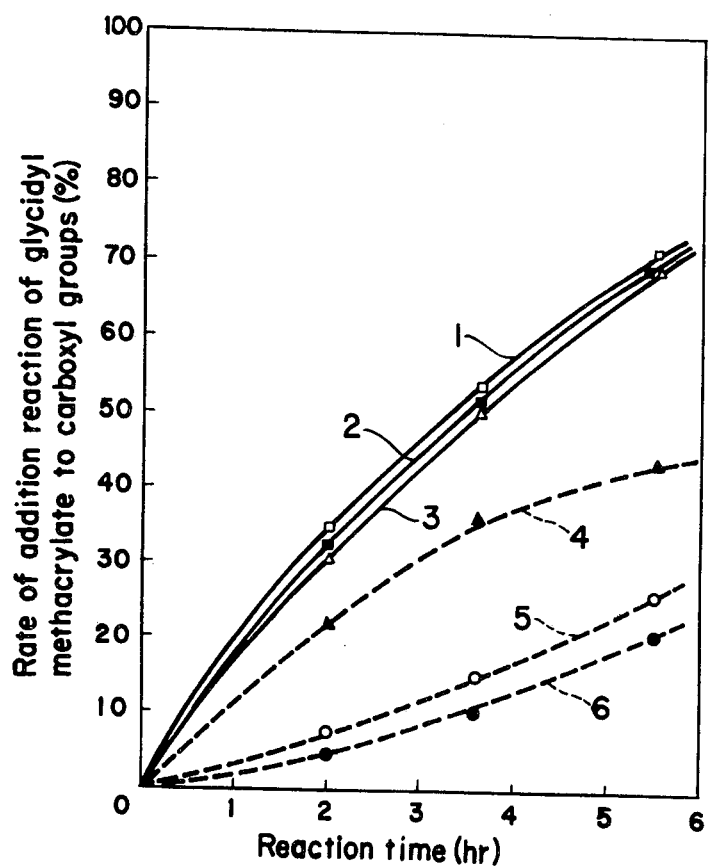

ADDITION POLYMERIZABLE POLYMERIC COMPOUNDS

This is a division of application Ser. No. 208,690 filed Dec. 16, 1971, now U.S. Pat. No. 3,796,578.

This invention relates to novel addition polymerizable polymeric compounds and to photopolymerizable compositions containing them and to elements containing these compositions.

Nearly all negative type presensitized plates now on sale employ so-called diazo type photosensitive materials which may be represented by the salts of condensate of para-diazodiphenylamine and formaldehyde. These presensitized plates have a high sensitivity but an insufficient printing durability. On the other hand photopolymer type presensitized plates exhibit a remarkably increased strength of the photopolymerized layer and thus an excellent printing resistance. As such presensitized plates for offset printing there are known, for example, polyvinyl cinnamate type plates and photopolymerizable type plates described in U.S. Pat. No. 3,458,311. The former must be developed with an organic solvent medium and such developing is not only economically disadvantageous but only pollutes the general environment. The latter, however, may be advantageously developed with an aqueous alkaline solution but it is not necessarily easy to completely wash out the non-exposed portions and scumming may easily be generated in the subsequent process of making a printing plate. Especially the developing ability and the generation of scumming greatly depend upon the temperature and it becomes fairly difficult to effect developing at a lower temperature, for example, at 5°C.

It is accordingly an object of this invention to provide a novel addition polymerizable polymeric compound which is especially useful as one component of photopolymerizable compositions.

Another object is to provide a novel photopolymerizable composition which is useful for various pattern or image yielding purposes and especially useful in making reliefs, particularly, lithographic plates.

Yet another object is to provide such photopolymerizable element which has good reproducibility of dots and developing ability with an aqueous alkaline solvent and thus not causing scumming in the process of making lithographic plates.

A still further object is to provide a lithographic plate which has an excellent printing durability.

Still further objects of this invention will become apparent from a consideration of this entire specification and claims.

In accord with an fulfilling these objects, there are provided an addition polymerizable polymeric compound produced by esterification reaction or addition reaction of a copolymer having pendent carboxyl groups and about 0.03 to 1.0 equivalent, based upon the carboxyl groups of said copolymer, of an ethylenically unsaturated compound having one oxirane ring, said copolymer being obtained by copolymerizing (1) about 10 to 95 percent by weight of at least one member selected from the group consisting of styrene and the methyl-substituted styrene derivatives (2) about 5 to 70 percent by weight of at least one ethylenically unsaturated mono- or di-carboxylic acid, its anhydride or its monoalkyl of 1 to 4 carbon atoms ester, (3) up to about 30 percent weight of at least one member selected from the group consisting of acrylonitrile and methacrylonitrile, (4) up to about 85 percent by weight of at least one compound of the formula

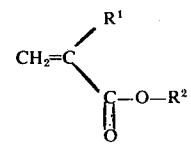

wherein $R^1$ represents a hydrogen atom or methyl group; and $R^2$ represents an alkyl group having 1 to 12 carbon atoms, and (5) up to about 50 percent by weight, based upon the total weight of said compound (3) and/or (4), of at least one vinyl ester of a saturated aliphatic mono-carboxylic acid having 2 to 10 carbon atoms, and a photopolymerizable composition comprising (A) an addition polymerizable polymeric compound, (B) at least one ethylenically unsaturated compound and (C) a photopolymerization initiator.

The addition polymerizable polymeric compounds of this invention are novel compounds and can be prepared by esterification reaction or addition reaction (hereinafter referred to addition reaction) of a copolymer having pendent carboxyl groups (hereinafter referred to as a base polymer) and about 0.03 to 1.0 equivalent, based upon the carboxyl groups of the base polymer, of an ethylenically unsaturated compound having one orirane ring. The base polymer can be obtained by copolymerizing (1) about 10 to 95 percent by weight of at least one member selected from the group consisting of styrene and the methyl-substituted styrene derivatives and (2) about 5 to 70 percent by weight of at least one ethylenically unsaturated aliphatic mono- or di-carboxylic acid, its anhydride or its monalklyl of 1 to 4 carbon atoms ester.

In order to obtain a non-tacky presensitized plate having an improved inking, it is necessary that the base polymer contains (1) about 10 to 95 percent by weight, preferably about 30 to 80 percent by weight, based upon the total weight of its constituents, of styrene or the methyl-substituted derivative. When the amount is less than about 10 percent weight, the polarity of the polymers having pendent ethylenically unsaturated groups, i.e., the addition polymerizable polymeric compounds, increases and resultedly the inking becomes poor. At the same time the glass transition temperature of the polymers having pendent ethylenically unsaturated groups lowers and the non-tackiness of presensitized plates reduces. Furthermore, the film performance of a layer of a photopolymerizable composition becomes inferior and unevenness as well as pinholes appear on the layer.

Examples of suitable methyl-substituted styrenes include alphamethyl styrene and vinyl toluene.

Also it is required that the base polymer contains (2) about 5 to 70 percent by weight, preferably about 15 to 50 percent by weight, based upon the total weight of its consituents, of at least one ethylenically unsaturated aliphatic mono- or di-carboxylic acid, its anhydride or its monoalkyl of 1 to 4 carbon atoms ester. When the amount is less than about 15 percent by weight it is impossible to incorporate sufficient pendent ethylenically unsaturated groups, which participate in photopolymerisation, into the addition polymerizable polymeric compound. Also the adhesion of addition polymerizable polymeric compound having pendent ethylenically unsaturated groups to a support material diminishes and moreover the solubility to an aqueous alkaline solution decreases. Consequently it is remarkably difficult to develop the exposed plate with an aqueous alkaline solution. On the other hand amounts of the ethylenically unsaturated aliphatic mono- or di-carboxylic acid, its anhydride or its monoalkyl of 1 to 40 carbon atoms ester of more than about 70 percent by weight remarkably increase the polarity of the base polymer and embrittle the photopolymerized product due to rising of the glass transition temperature of the base polymer. The inking also becomes poor and the quality of presensitized plates changes depending upon the environment because the addition polymerizable polymeric compound becomes hygroscopic.

Examples of suitable ethylenically unsaturated aliphatic mono- or di-carboxylic acid, anhydrides monoalkyl of 1 to 4 carbon atoms esters thereof include acrylic acid, methacrylic acid, maleic acid, fumaric acid, crotonic acid, itaconic acid, vinylacetic acid, alpha-ethyl acrylic acid, angelic acid, maleic anhydride, itaconic anhydride, monomethyl maleate, itaconate or fumarate, monoethyl maleate, itaconate or fumarate, mono-n-proply maleate, itaconate or fumarate, mono-isopropyl maleate, itaconate or fumarate and mono-n-butyl maleate, itaconate or fumarate.

In order to obtain an improved strength of a layer of a photopolymerizable composition and improved resistances to solvent, printing ink, abrasion and printing after photopolymerization, it is preferred to employ (3) acrylonitrile or methacrylonitrile in an amount of up to about 30 percent by weight, preferably about 2 to 20 percent by weight in the production of the base polymer. When the amount is more than about 30 percent by weight, the solubility of addition polymerizable compound having pendent ethylenically unsaturated groups to a solvent medium reduces and the developing is very difficult.

In order to increase the strength of the layer of a photopolymerizable composition by internal plasticization, the adhesion of the layer to a support material and consequently the resistance to printing after photopolymerization it is preferred that the base polymer additionally contains (4) up to about 85 percent by weight, preferably about 2 to 65 percent by weight of a compound of the formula

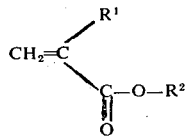

wherein $R^1$ represents a hydrogen atom or methyl group; $R^2$ represents an alkyl group having 1 to 12 carbon atoms.

When the amount is more than 50 percent by weight, some kinds of the compound (4) tend to render the surface of presensitized plates slightly viscous depending on the storage temperature. In such cases this disadvantage may be removed by providing a protective stratum of a non-tacky polymeric compound which is soluble to an aqueous alkaline solution on the layer of a photopolymerizable composition. The protective stratum may be washed out in the developing process and therefore does not affect the performance of the photopolymerized articles.

Examples of suitable compounds (4) include methyl acrylate or methacrylate, ethyl acrylate or methacrylate, n-propyl acrylate or methacrylate, isopropyl acrylate or methacrylate, butyl acrylate or methacrylate, hexyl acrylate or methacrylate, octyl acrylate or methacrylate, dodecyl acrylate or methacrylate, 2-ethyl hexyl acrylate or methacrylate and lauryl acrylate or methacrylate.

Furthermore, in order to obtain the same improved properties as the compound (4) it is preferred that the base polymer contains (5) up to about 50 percent by weight, based upon the total weight of the compound (3) and/or (4), of one vinyl ester of a saturated aliphatic non-carboxylic acid having 2 to 10 carbon atoms. When the amount is more than about 50 percent, the inking of the photopolymerized articles diminishes and the vinylesters substantially do not copolymerize with styrene or the methyl-substituted derivative thereof.

Examples of suitable compounds (5) include vinyl acetate, vinyl propionate, vinyle butyrate, vinyl valerate, vinyl decanoate and vinyl versatate.

The base polymers according to this invention may be produced by copolymerizing the above-described constituents (1) to (5) in the conventional solution polymerization method, emulsion polymerization method or suspension polymerization. In this copolymerization reaction peroxides and azo compounds may be employed as the polymerization initiators but the polymerization initiators having a high rate of decomposition are preferred in consideration of storage stability as a presensitized plate.

Such polymerization initiators include peroxides such as benzoyl peroxide, cumene hydroperoxide, tertiary butyl peroxide, diisopropyl peroxy dicarbonate; and azo compounds such as 2,2'-azo-bis-isobutyronitrile, 2,2'-azo-bis-2,4-dimethyl valeronitrile, 2,2'-azo-bis-2,4-dibutyl valeronitrile and are preferably employed in an amount of from about 0.1 to 5 percent by weight based on the total weight of the monomeric compounds.

The co-polymerization is effected at a temperature of from about 40°C. to 90°C. for about 1 to 18 hours.

The polymers having a pendent ethylenically unsaturated groups of the present invention may be produced by addition reaction of an ethylenically unsaturated compound having one oxirane ring with the carboxyl groups of the base polymers.

Suitable examples of the solvent medium include ketones such as methylethyl ketone, methylbutyl ketone; esters such as ethyl acetate, butyl acetate; alcohols such as 2-propanol, 1-butanol; ethers such as ethylene glycol monobutyl ether, dioxane and aromatic hydrocarbons such as benzen, toluene.

It has now been found that a solvent medium containing about 75 or more than 75 percent by weight of an alcohol having 3 to 5 carbon atoms not only results in good stability of addition reaction even in a higher concentration but also a higher rate of addition reaction with stability.

Exemplary such alcohols having 3 to 5 carbon atoms include 1-propanol, 1-butanol, 1-pentabol, the isomers thereof and the mixtures thereof. The solvent media which may be used together with the above-described alcohols in an amount of less than 25 percent by weight include ketones such as methylethyl ketone, methylisobulyl ketone, esters such as ethyl acetate, butyl acetate, and alcohols such as methanol, ethanol.

When the reaction is carried out using other solvent media than those containing about 75 or more than 75 percent by weight of an alcohol having 3 to 5 carbon atoms, the concentration of reaction have to be maintained low in order to prevent the gellation during the reaction.

It has now been found that when a quaternary ammonium compound of the formula

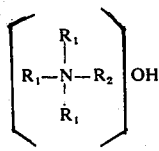

wherein $R_1$ represents an alkyl group having 1 to 8 carbon atoms; and $R_2$ represents an alkyl group having 1 to 8 carbon atoms, a chlorinated or brominated alkyl group having 1 to 8 carbon atoms, phenyl group or an aralkyl group containing an alkyl group having 1 to 8 carbon atoms, is used as a catalyst in the reaction of a compound containing a carboxyl group with a compound containing an oxirane group, the reaction proceeds much more rapidly to efficiently give a polymeric compound having pendent ethylenically unsaturated groups.

Exemplary quaternary ammonium compounds includes trimethylphenyl ammonium hydroxide, trimethyldodecyl ammonium hydroxide, trimethylhexadecyl ammonium hydroxide, trimethyl (beta-bromoethyl) ammonium hydroxide, trimethylbenzyl ammonium hydroxide, trimethyl (beta-hydroxyethyl) ammonium hydroxide, triethylbenzyl ammonium hydroxide, tetramethyl ammonium hydroxide, tetraethyl ammonium hydroxide, tetra (n-propyl) ammonium hydroxide and tetra (n-butyl) ammonium hydroxide.

These compounds are preferably used in an amount of from about 0.5 to 10 percent by weight based on the weight of the ethylenically unsaturated compound having one oxirane ring.

Known polymerization inhibitors are preferably employed in order to prevent vinyl-type addition polymerization of the ethylenically unsaturated compound having one oxirane ring.

Such polymerization inhibitors and reducing compounds include, for example, hydroquinone, hydroquinone monomethylether, hydroquinone memoethylether, metallic copper, and may be employed in the range of about 0.01 to 5 percent by weight, preferably about 0.1 to 3 percent by weight based upon the weight of the ethylenically unsaturated compound having one oxirane ring.

Exemplary ethylenically unsaturated compounds include glycidyl acrylate, glycidyl methacrylate, allyl glycidylether, glycidyl alpha-ethyl acrylate, crotonyl glycidyl ether, glycidyl crotonate, monomethyl or monoethyl itaconate monoglycidyl ester and monomethyl or monoethyl fumarate monoglycidyl ester.

The ethylenically unsaturated compound having one oxirane ring is reacted with the polymer having pendent carboxyl groups in an amount of from about 0.03 to 1.0 equivalent, preferably from about 0.10 to 0.80 equivalent based on the carboxyl groups of the polymer.

The addition reaction is generally effected at a temperature of from about 60°C. to 90°C. for about 1 hour to 12 hours.

The photopolymerizable compositions of this invention comprise (A) one of the above-described addition polymerizable polymeric compounds, (B) at least one ethylenically unsaturated monomer and (C) a photopolymerization initiator.

As the second component of the photopolymerizable compositions of this invention, in order to obtain a non-tacky presensitized plate having a high photosensitivity it is preferred to employ (i) acrylamide type ethylenically unsaturated monomers represented by one of the two following general formulae;

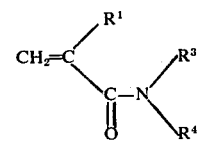

and

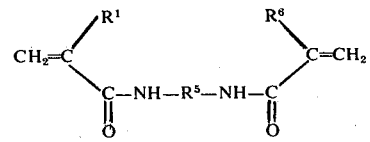

wherein $R^1$ and $R^6$ represent independently a hydrogen atom or methyl group; $R^3$ represents a hydrogen atom or alkyl group having 1 to 4 carbon atoms; $R^4$ represents a hydrogen atom, $-C_mH_{2m+1}$ wherein $m$ is an integer of 1 to 6, cyclohexyl group, $-(CH_2)_n-OH$ wherein $n$ is an integer of 1 to 5, $-(CH_2)_p-O-C_qH_{2q+1}$ wherein $p$ is an integer of 1 to 2 and $q$ is an integer of 1 to 5 or $-CH_2-CH=CH_2$; $R^5$ represents $-(CH_2)_r$ wherein $r$ is an integer of 1 to 10.

Examples of suitable compounds (i) include acrylamide, methacrylamide, N,N-dimethylacrylamide, N-isopropylacrylamide, N-hexylacrylamide, N-cyclohexylacrylamide, N-methylolacrylamide, N-ethylolacrylamide, N-amyloacrylamide, N-allylacrylamide, N,N'-methylene-bisacrylamide, N,N'-trimethylenebisacrylamide, N,N'-hexamethylenebisacrylamide, N,N'-decamethylenebisacrylamide, N-methoxyethylacrylamide, N-methylmethacrylamide, N-allylmethacrylamide, N-methylolmethacrylamide, N,N'-methylenebismethacrylamide and N-ethoxyethylmethacrylamide.

Also in order to obtain a presensitized plate having a high photosensitivity and a good storage stability it is preferred to employ (ii) acrylate type ethylenically unsaturated monomers represented by one of the following two general formulae;

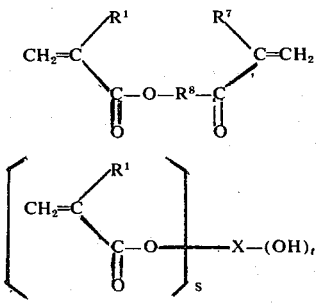

wherein $R^1$ and $R^7$ represent independently a hydrogen atom or methyl group; $R^8$ represents $-(CH_2-CH-$ $_2$—O)$_u$— wherein $u$ is an integer of 1 to 15; X represents a radical of a tri-ol or a tetra-ol; $s$ is an integer of 1 to 4 and $t$ is 0 or an integer of 1 to 3 and $s + t = 3$ or 4.

Example of suitable compounds (ii) include diethyleneglycol di-acrylate or -methacrylate, triethyleneglycal diacrylate or -methacrylate, tetraethyleneglycol di-acrylate or -methacrylate, hexamethyleneglycol di-acrylate or -methacrylate, tetradecylethyleneglycol di-acrylate or -methacrylate, tetramethylolmethane tetra-acrylate or -methacrylate, tetramethylolmethane tri-acrylate, or -methacrylate, tetramethylolmethane di-acrylate or -methacrylate, tetramethylolmethane monoacrylate or -methacrylate, trimethylolmethane tri-acrylate or -methacrylate, trimethylolmethane di-acrylate or -methacrylate, trimethylolmethane monoacrylate or -methacrylate.

Other ethylenically unsaturated compounds (iii) may also be employed as the second component of the photopolymerizable compositions. Examples of such compounds include acrylic acid, alpha-chloroacrylic acid, methacrylic acid, methy methacrylate, methyl alpha-chloroacrylate, methyl acrylate, ethyl acrylate, n-butyl acrylate, isobutyl acrylate, n-propyl acrylate, isopropyl acrylate, 2-ethyl-hexyl acrylate, n-octyl acrylate, n-decyl acrylate, n-tetradecyl acrylate, allyl acrylate, furfuryl acrylate, glycidyl acrylate, n-butyl methacrylate, isobutyl methacrylate, 2-ethylhexyl methacrylate, lauryl methacrylate, furfuryl methacrylate, 2-hydroxyethyl methacrylate, 2-hydroxypropyl methacrylate, 2-hydroxylhexyl methacrylate, glycidyl methacrylate, styrene, divinylbenzene, alpha-methylstyrene, vinyltoluene, alpha-chlorostyrene, vinylchlorobenzene, vinylphenol, aminostyrene, vinylbenzoic acid, methoxystyrene, allylbenzene, diallylbenzene, allyltoluene, monoallylphthalate, diallylphthalate, allylalcohol, allylacetate, vinylacetate, vinylpropionate, maleic acid, fumaric acid, itaconic acid, dimethyl maleate, diethyl maleate, dimethyl fumarate, diethyl fumarate, dimethyl itaconate, diethyl itaconate, cinnamic acid, ethylvinylether, propylvinylether, methylvinylketone, acrolein, vinylidene chloride, vinylpyridine, vinylpyrrolidone, diethylvinylamine, vinylcarbazole.

These compounds are preferably used is an amount of from about 5 to 70 parts by weight, more preferably from about 20 to 50 parts by weight based upon 100 parts by weight of addition polymerizable polymeric compound.

Exemplary photopolymerization initiators include alpha-carbonyl alcohols and alpha-carbonyl ethers such as benzoin, alpha-methyl benzoin, alpha-phenyl bezoin, alpha-allyl benzoin, alpha-benzyl benzoin, butyroin, acetoin, benzoin methyl ether, benzoin ethyl ether, pivaloin ethyl ether, anisoin ethyl ether, anthraquinones such as anthraquinone, 2-methyl anthraquinone, 2-ethyl anthraquinone, 2-tertiary butyl anthraquinone, 1-chloroanthraquinone, 2-bromoanthraquinone, 2-nitroanthraquinone, anthraquinone-1-aldehyde, anthraquinone-2-thiol, 4-cyclohexyl anthraquinone, 1,4-dimethyl anthraquinone, 1-methoxy anthraquinone, anthraquinone-1-carbonyl chloride benzanthraquinone, sulfides such as diphenyl disulfide, tetraethyl thiouram, diketones such as benzil, diacetyl; uranyl salts such as uranyl nitrate, uranyl propionate; and azo compounds such as azo-bis-isobutyronitrile.

These photopolymerization initiators are preferably used in an amount of from about 0.0001 to 10 precent by weight of the total weight of the total weight of the photopolymerizable composition.

Known stabilizers may be employed for the purpose of maintaining storage stability (shelf life) of the photopolymerizable compositions. Such stabilizers may be added when the components of photopolymerizable composition are admixed or may be added to each component separately prior to admixing of the components.

Exemplary stabilizers include hydraquinone, hydraquinone monomethyl ether, hydroquinone momoethyl ether, hydroquinone tertiary butyl ether, benzoquinone, p-methoxy phenol, 2,5-diphenyl-p-benzophenone, phridine, phenothiazine, p-diamino benzene, beta-naphthol, naphthylamine, pyrogallol, tertiary butyl catechol and nitrobenzene.

These stabilizers are added only for proventing thermal polymerization without the actinic radiation set forth above without restraining the photopolymerization. Consequently the amount of the stabilizers may be preferably 0.001 to 10 percent by weight of the total weight of the photopolymerizable composition.

Furthermore, various compounds such as fillers and plasticizers may be incorporated into the photopolymerizable compositions in order to improve the mechanical properties after photopolymerization. These compounds include, for example, mica, fine powdery silicon oxides and glass, polyethylenes, polyesters, polyethylene-oxides, polymethylmethacrylates, cellulose and cellulose esters; and dibutylphthalate, dioctylphthalate, oligoethyleneglycol monoalkylesters, oligoethyleneglycol dialkylesters and tricresylphosphate.

The solutions of photopolymerizable compositions are obtained by dissolving above-mentioned components in a solvent. Examples of such solvent medium include esters such as ethyl acetate, butyl acetate, ketones such as methylethyl ketone, alcohols such as 2-propanol, 1-butanol tertiary butyl alcohol; ethers such as dioxane; aromatic hydrocarbons such as benzene; and the mixtures of these compounds.

The concentration of the solutions depends upon the coating methods and conditions of the solutions onto base or support materials. For example the concentration of the components of photopolymerizable compositions is preferably about 2 to 20 percent by weight for preparing presensitized plates for offset printing by a whiler.

Examples of suitable support materials include metals such as aluminium, zinc, tin, stainless steel, chromium-copper binetal, chromium-copper aluminium trimetal plates, sheets and foiled and plastics such as polyester, polymethylmethacrylate, polyvinylchloride, polyvinylidenechloride, polystyrene films and plates and laminates of a plastic film and a metal foil such as aluminium. The thickness of these support materials is preferably in the range of about 0.05 mm. to 0.90 mm., more preferably in the range of about 0.10 mm. to 0.75 mm.

These support materials preferably have a hydrophilic surface at the time the layer of a photopolymerizable composition is applied. The surface may be roughened mechanically, chemically or electro-chemically in order to improve retention of aqueous liquids and to improve adhesion of layers of photopolymerizable compositions to be applied thereon.

The solutions of photopolymerizable compositions may be coated on a support material by hand or by a whirler, a roll coater, or a curtain coater.

The thickness of a layer of photopolymerizable compositions is preferably in the range of about 0.3 micron to 50 microns when dry. When the thickness is less than 0.3 micron, it is very difficult to completely coat a roughened surface of support materials and consequently printing plates having a uniform layer of photopolymerizable composotions are hardly obtained. On the other hand, the thickness of more than about 50 microns results in cracks in the layer photopolymerizable compositions when stored for a long time and diminishes adhesion between the support material and the layer of photopolymerizable compositions in the course of time and furthermore, process of coating the solution and drying the coated layer has to be repeated.

For example, the preparation of a lithographic plate, the photopolymerizable element is placed in a vacuum from and exposed at room temperature to a source irradiating actinic radiation through a process transparency, e.g., a negative or positive film. Practical sources of such actinic radiation include carbon arc lamps, mercury lamps, xenon lamps and chemical lamps. After removal of the transparency, the non-image areas are washed out with a solvent liquid such as an aqueous solution or an organic solvent. Exemplary solvent liquids include aqueous solutions of sodium hydroxide. potassium hydroxide, sodium carbonate, sodium bicarbonate, disodium hydrogenphosphate and sodium phosphate or together with methanol, ethanol, 2-propanol, acetone or methylethyl ketone; and acetone, methylethyl ketone, ethyl acetate, methyl-isobutyl ketone, n-butyl acetate, dioxane and chloroform. A processor with a spray nozzle or a brush may be used but a by-hand washing and a pouring type washing are also possible. Then the surface of the plate is treated with a conventional densensitizing agent. If necessary, lacquering and inking may be applied to the resulting plate. Also bi-metal printing plates can be obtained by etching and peeling-off after developing.

This invention will now be illustrated by the following syntheses and examples in which parts are all by weight unless expressly stated to the contrary.

PREPARATION OF ADDITION POLYMERIZABLE POLYMERIC COMPOUNDS

SYNTHESIS 1

In a 2 l. four-necked flask equipped with a stirrer, a reflux condenser, a dropping funnel and a thermometer, there were charged 100 parts of 2-propanol as a reaction medium and heated at 80°C. while replacing the air in the flask with a nitrogen gas. To the dropping funnel there was added a mixture of 70 parts of styrene, 30 parts of acrylic acid and 3 parts of N,N'-azo-bis-isobutyronitrile as a catalyst and the mixture was added dropwise over 2.5 hours and the resulting mixture was heated at 80°C. for 5.5 hours to complete the reaction. This reaction mixture was cooled at 60°C., and 96 parts of 2-propanol, 0.3 part of hydroquinone and 3.75 parts of a 40 percent methanol solution of trimethylbenzyl ammonium hydroxide as a catalyst were added thereto. After raising the temperature of the mixture to 80°C., 30 parts of glycidyl methacrylate containing 0.3 part of hydroquinone were added dropwise thereto over one hour and the reaction was further continued for 4 hours. After cooling the reaction mixture to room temperature, there was obtained a yellowish viscous polymer solution. A rate of addition reaction of the glycidyl methacrylate to the resulting polymer based upon the carboxyl groups was 68 percent.

SYNTHESES 2 to 5

The procedure of Synthesis 1 for preparing base polymers was repeated except that the monomer mixtures set forth in Table 1 were used. Also the addition reaction of gylcidyl methacrylate to the carboxyl groups of each resulting base polymer was carried out in the same manner as in Synthesis 1. The results are shown in Table 1.

Table 1

| Synthesis No. | Monomer mixture (parts) | | Rate of addition reaction of glycidyl methacrylate to carboxyl group (percent) |
|---|---|---|---|
| 2 | Styrene | 63 | 65 |
|   | Acrylonitrile | 30 | |
|   | Acrylic acid | 7 | |
| 3 | Styrene | 60 | 66 |
|   | Acrylic acid | 30 | |
|   | n-Butyl acrylate | 10 | |
| 4 | Styrene | 60 | 69 |
|   | Acrylic acid | 30 | |
|   | n-Butyl acrylate | 6 | |
|   | Vinyl acetate | 4 | |
| 5 | Styrene | 60 | 68 |
|   | Acrylic acid | 30 | |
|   | Acrylonitrile | 5 | |
|   | n-Butyl acrylate | 5 | |

SYNTHESIS 6

The procedure of Synthesis 1 for preparing a base polymer was repeated except that the following monomer mixture was used together with 1 part of n-dodecyl merceptan as the polymerization regulator.

| Styrene | 60 |
|---|---|
| Acrylic acid | 30 |
| Acrylonitrile | 5 |
| 2-Ethylehexyl acrylate | 5 |

Then the reaction mixture thus obtained was reacted with 30 parts of glycidyl methacrylate in the same manner as in Synthesis 1. A rate of addition reaction of the glycidyl methacrylate to the resulting polymer based on the carboxyl groups was 66 percent.

SYNTHESIS 7

The procedure of Synthesis 1 for preparing a base polymer was repeated except that 90 parts of 2-propanol and 10 parts of methylethyl ketone was used as the reaction solvent and the following monomer mixture was used together with 2 parts of n-dodecyl mercaptan as the polymerization regulator.

| | (parts) |
|---|---|
| Styrene | 54 |
| Methacrylic acid | 36 |
| Acrylonitrile | 5 |
| Ethyl acrylate | 5 |

To the reaction mixture thus obtained there were added 90 parts of 2-propanol, 6 parts of methylethyl ketone, 0.3 part of hydroquinone and 6 parts of a 40 percent methanol solution of trimethylbenzyl ammonium hydroxide. After raising the temperature of the mixture to 80°C., 25 parts of glycidyl acrylate containing 0.3 part of hydroquinone were added dropwise to the mixture over one hour to give a yellowish transparent polymer solution. A rate of addition reaction of the glycidyl acrylate to the resulting polymer based upon the carboxyl groups was 70 percent.

SYNTHESIS 8

The procedure of Synthesis 1 for preparing a base polymer was repeated except that 90 parts of 2-propanol and 10 parts of ethyl acetate were used as the reaction solvent and the following monomer mixture was used together with 2 parts of benzoyl peroxide as the catalyst.

|  | (parts) |
|---|---|
| Styrene | 58 |
| Acrylic acid | 30 |
| Acrylonitrile | 7 |
| n-Octyl acrylate | 5 |

The reaction mixture thus obtained was cooled to 60°C. and 0.2 part of hydroquinone, one part of metallic copper, 90 parts of 2-propanol, 10 parts of ethyl acetate and 3.75 parts of a 40 percent methanol solution of trimethylbenzyl ammonium hydroxide were added thereto. After raising the temperature of the mixture to 80°C., 30 parts of glycidyl methacrylate containing 0.2 part of hyroquinone were added dropwise to the mixture over one hour and the reaction was further continued for 4 hours. A rate of addition reaction of the glycidyl methacrylate to the resulting polymer based upon the carboxyl groups was 69 percent.

SYNTHESIS 9

Synthesis 1 was repeated except that the following monomer mixture was used.

|  | (parts) |
|---|---|
| Styrene | 5 |
| Acrylic acid | 30 |
| Acrylonitrile | 20 |
| Methyl methacrylate | 45 |

A rate of addition reaction of the glycidyl methacrylate to the resulting polymer based upon the carboxyl groups was 67 percent.

SYNTHESIS 10

The procedure of Synthesis 1 for preparing a base polymer was repeated except that the following monomer mixture was used.

|  | (parts) |
|---|---|
| Styrene | 87 |
| Acrylic acid | 3 |
| Acrylonitrile | 5 |
| n-Butyl acrylate | 5 |

Then the reaction mixture thus obtained was reacted with 3 parts of glycidyl methacrylate in the same manner as in Synthesis 1. A rate of addition reaction of the glycidyl methacrylate to the resulting polymer based upon the carboxyl groups was 70 percent.

SYNTHESIS 11

The procedure of Synthesis 1 for preparing a base polymer was repeated except that the following monomer mixture was used.

|  | (parts) |
|---|---|
| Styrene | 85 |
| Acrylic acid | 15 |
| n-Butyl acrylate | 5 |

Then the reaction mixture thus obtained was reacted with 7 parts of glycidyl tethacrylate in the same manner as in Synthesis 1. A rate of addition reaction of the glycidyl methacrylate to the resulting polymer based upon the carboxyl groups was 67 percent.

SYNTHESIS 12

The procedure of Synthesis 1 for preparing a base polymer was repeated except that the following monomer mixture was used.

|  | (parts) |
|---|---|
| Styrene | 40 |
| Acrylic acid | 50 |
| Acrylonitrile | 10 |

Then the reaction mixture thus obtained was reacted with 25 parts of glycidyl methacrylate in the same manner as in Synthesis 1. A rate of addition reaction of the glycidyl methacrylate to the resulting polymer based upon the carboxyl groups was 65 percent.

SYNTHESIS 13

The procedure of Synthesis 1 for preparing a base polymer was repeated except that the following monomer mixture was used and the weight ratio of the monomer mixture to the reaction solvent was 1 : 9.

|  | (parts) |
|---|---|
| Styrene | 10 |
| Acrylic acid | 80 |
| Acrylonitrile | 10 |

Then the reaction mixture thus obtained was reacted with 60 parts of glycidyl methacrylate in the same manner as in Synthesis 1 except that the weight ratio of the base polymer to the reaction solvent was 1 : 9. A rate of addition reaction of the glycidyl methacrylate to the resulting polymer based upon the carboxyl groups was 70 percent.

SYNTHESIS 14

The procedure of Synthesis 1 for preparing a base polymer was repeated except that the following monomer mixture was used.

|  | (parts) |
|---|---|
| Styrene | 50 |
| Acrylic acid | 30 |
| Acrylonitrile | 20 |

Then the reaction mixture was reacted with 30 parts of glycidyl methacrylate in the same manner as in Synthesis 1. A rate of addition reaction of the glycidyl methacrylate to the resulting polymer based upon the carboxyl groups was 63 percent.

SYNTHESIS 15

The procedure of Synthesis 6 was repeated except that the following monomer mixture was used and the weight ratio of the monomer mixture to the reaction solvent was 1 : 9.

|  | (parts) |
|---|---|
| Styrene | 20 |
| Acrylic acid | 35 |
| Acrylonitrile | 35 |
| n-Butyl acrylate | 5 |
| Methyl acrylate | 5 |

The reaction mixture thus obtained was reacted with 40 parts of glycidyl methacrylate in the same manner except that the weight ratio of the base polymer to the reaction solvent was 1 : 9. A rate of addition reaction of the glycidyl methacrylate to the resulting polymer based upon the carboxyl groups was 68 percent.

SYNTHESES 16 to 27

Synthesis 1 was repeated except that the monomer mixtures and glycidyl acrylate or methacrylate set forth in Table 2 were used. The results are shown in Table 2.

SYNTHESIS 28

The procedure of Synthesis 1 for preparing a base polymer was repeated except that the following monomer mixture was used.

|  | (parts) |
|---|---|
| Styrene | 60 |
| Acrylic acid | 25 |
| Acrylonitrile | 10 |
| n-Butyl acrylate | 5 |

Then the reaction mixture was reacted with 30 parts of glycidyl methacrylate in the same manner as in Synthesis 1 except that trimethylphenyl ammonium hydroxide was used as the catalyst. A rate of addition reaction of the glycidyl methacrylate to the resulting polymer based upon the carboxyl groups was 66 percent.

SYNTHESIS 29

The procedure of Synthesis 1 for preparing a base polymer was repeated except that the following monomer mixture was used.

|  | (parts) |
|---|---|
| Styrene | 60 |
| Acrylic acid | 25 |
| Acrylonitrile | 10 |
| n-Butyl acrylate | 5 |

Table 2

| Synthesis No. | Monomer mixture(parts) | | Glycidyl acrylate or methacrylate (parts) | | Rate of addition reaction of glycidyl acrylate or methacrylate to carboxyl groups (percent) |
|---|---|---|---|---|---|
| 16 | Styrene | 10 | Glycidyl methacrylate | 20 | 65 |
|  | Acrylic acid | 20 |  |  |  |
|  | Methyl methacrylate | 65 |  |  |  |
|  | n-Butyl acrylate | 5 |  |  |  |
| 17 | Alpha-methyl stylene | 80 | Glycidyl acrylate | 30 | 61 |
|  | Acrylic acid | 20 |  |  |  |
| 18 | Vinyltoluene | 65 | Glycidyl methacrylate | 30 | 69 |
|  | Acrylic acid | 30 |  |  |  |
|  | Acrylonitrile | 5 |  |  |  |
| 19 | Styrene | 83 | Glycidyl acrylate | 30 | 60 |
|  | Itaconic acid | 7 |  |  |  |
|  | n-Butyl acrylate | 10 |  |  |  |
| 20 | Styrene | 60 | Glycidyl methacrylate | 30 | 62 |
|  | Monoethyl maleate | 25 |  |  |  |
|  | Acrylonitrile | 10 |  |  |  |
|  | n-Butyl acrylate | 5 |  |  |  |
| 21 | Styrene | 45 | Glycidyl acrylate | 30 | 67 |
|  | Methacrylic acid | 40 |  |  |  |
|  | Acrylonitrile | 5 |  |  |  |
|  | Lauryl acrylate | 10 |  |  |  |
| 22 | Styrene | 55 | Glycidyl methacrylate | 30 | 64 |
|  | Acrylic acid | 35 |  |  |  |
|  | Methacrylonitrile | 10 |  |  |  |
| 23 | Styrene | 65 | Glycidyl acrylate | 30 | 69 |
|  | Acrylic acid | 25 |  |  |  |
|  | Acrylonitrile | 5 |  |  |  |
|  | Methacrylonitrile | 5 |  |  |  |
| 24 | Styrene | 60 | '' |  | 67 |
|  | Methacrylic acid | 30 |  |  |  |
|  | n-Butyl acrylate | 6 |  |  |  |
|  | Vinyl propionate | 4 |  |  |  |
| 25 | Styrene | 30 | Glycidyl methacrylate | 30 | 70 |
|  | Acrylic acid | 70 |  |  |  |
| 26 | Styrene | 50 | '' |  | 69 |
|  | Acrylic acid | 50 |  |  |  |
| 27 | Styrene | 95 | '' |  | 67 |
|  | Acrylic acid | 5 |  |  |  |

Then the reaction mixture was reacted with 30 parts of glycidyl methacrylate in the same manner as in Synthesis 1 except that tetraethyl ammonium hydroxide was used as the catalyst. A rate of addition reaction of the glycidyl methacrylate to the resulting polymer based upon the carboxyl groups was 70 percent.

SYNTHESIS 30

The procedure of Synthesis 1 for preparing a base polymer was repeated except that the following monomer mixture was used.

|  | (parts) |
|---|---|
| Styrene | 70 |
| Acrylic acid | 30 |

Then the reaction mixture was reacted with 30 parts of glycidyl alpha-ethyl acrylate in the same manner as in Synthesis 1. A rate of addition reaction of the glycidyl alpha-ethyl acrylate to the resulting polymer based upon the carboxyl groups was 60 percent.

SYNTHESIS 31

The procedure of Synthesis 1 for preparing a base polymer was repeated except that the following monomer mixture was used.

|  | (parts) |
|---|---|
| Styrene | 55 |
| Methacrylic acid | 30 |
| Methacrylonitrile | 10 |
| Ethyl acrylate | 5 |

Then the reaction mixture was reacted with 30 parts of allylglycidyl ether in the same manner as in Synthesis 1. A rate of addition reaction of the allylglycidyl ether to the resulting polymer based upon the carboxyl groups was 62 percent.

SYNTHESIS 32

The procedure of Synthesis 1 for preparing a base polymer was repeated except that the following monomer mixture was used.

|  | (parts) |
|---|---|
| Acrylic acid | 30 |
| Methyl methacrylate | 7 |

Then the reaction mixture was reacted with 30 parts of glycidyl methacrylate in the same manner as in Synthesis 1. A rate of addition reaction of the glycidyl methacrylate to the resulting polymer based on the carboxyl groups was 64 percent.

SYNTHESIS 33

The procedure of Synthesis 1 for preparing a base polymer was repeated except that the following monomer mixture was used.

|  | (parts) |
|---|---|
| Methacrylic acid | 35 |
| Methyl methacrylate | 65 |

Then the reaction mixture was reacted with 30 parts of glycidyl acrylate in the same manner as in Synthesis 1. A rate of addition reaction of the glycidyl acrylate to the resulting polymer based upon the carboxyl groups was 65 percent.

SYNTHESIS 34

In a 500 ml., four-necked flask equipped with a stirrer, a reflux condenser, a dropping funnel and a thermometer, there were charged 100 g. of 2-propanol as a reaction medium and heated at 80° C. while replacing the air in the flask with a nitrogen gas. To the dropping funnel there was added a mixture of 60 g. of styrene, 30 g. of acrylic acid, 5 g. of acrylonitrile, 5 g. of n-butyl acrylate and 3 g. of N,N'-azo-bis-iso-butyronitrile as a catalyst and the mixture was added dropwise over 2.5 hours and the resulting mixture was heated at 80° C. for 5.5 hours to complete the reaction. A conversion of the monomers obtained by the weight method was 99 percent.

The resulting reaction mixture was then cooled at 60° C., and 96 g. of 2-propanol, 0.3 g. of hydroquinone and 3.75 g. of a 40 percent methanol solution of trimethylbenzyl ammonium hydroxide as a catalyst were added thereto. After raising the temperature of the mixture to 80° C., 30 g. of glycidyl methacrylate containing 0.3 g. of hydroquinione were a added dropwise thereto over one hour and the reaction was further continued for 4.5 hours. After cooling the resulting reaction mixture to room temperature, there was obtained a yellowish viscous polymer solution. A rate of addition reaction of the glycidyl methacrylate to the carboxyl groups at various reaction steps was obtained by measuring unreacted carboxyl groups by an alkali potentiometric titration method using, as an alkali, a 0.1 N benzyl alcohol solution of potassium hydroxide. The results are shown in figure as Number 1. A final rate of addition reaction of the glycidyl methacrylate to the carboxyl groups was 72 percent.

SYNTHESIS 35

Synthesis 34 was repeated except that 3.75 g. of a 40 percent 2-propanol solution of triethylbenzyl ammonium hydroxide was used as a catalyst. The result is shown as Number 2 in figure and a final rate of addition reaction of the glycidyl methacrylate to the carboxyl groups was 70 percent.

SYNTHESIS 36

Synthesis 34 was repeated except that 3.75 g. of a 40 percent methanol solution of tetramethyl ammonium hydroxide was used as a catalyst. The result is shown as Number 3 in figure and a final rate of addition reaction of the glycidyl methacrylate to the carboxyl groups was 70 percent.

COMPARATIVE SYNTHESES 1 to 3

Synthesis 34 was repeated except that the 40 percent methanol solution of trimethylbenzyl ammonium hydroxide as a catalyst was replaced by dimethylbenzyl amine, N,N-diethylcyclohexyl amine or triethyl amine. The results are shown Table 3.

Table 3

| Comparative synthesis No. | Catalyst and its solvent (g.) | Final rate of addition reaction of glycidyl methacrylate to carboxyl groups (% & No. in Figure) |
| --- | --- | --- |
| 1 | Dimethyl benzyl amine 1.50 Methanol 2.25 | 44 (No.4) |
| 2 | N,N-diethylcyclohexyl amine 1.50 Methanol 2.25 | 27 (No.5) |
| 3 | Triethyl amine 1.50 Methanol 2.25 | 22 (No.6) | resulting presensitized plate was placed in a vacuum frame and exposed to a carbon arc lamp (200V, 30A) at a distance of 75 cm. for 45 seconds through a negative. After washing off the non-exposed portions with a one percent sodium carbonate solution the plate was subjected to washing with water, inking and gum arabic coating to give a lithographic plate for offset printing. Using each of the resulting plates an offset printing was carried out by a sheet-fed press to give clear and precise impressions. The results are shown in Table 4. It is clearly understood that the polymer containing acrylonitrile or the polymer containing acrylonitrile and n-butyl acrylate give much improved photosensitivity to the presensitized plate and inking and resistance to printing to the printing plate.

Table 4

| Example No. | Polymer syntheses No. | Tackiness of photosensitive layer at 20°C. | Film performance of photosensitive layer(1) | Photosensitivity (exposure time) (sec.)(2) | Developing time (min.)(3) | Resistance to solvent(4) | Inking(5) | Resolving power(6) (line/inch) | Resistance to printing (order) |
| --- | --- | --- | --- | --- | --- | --- | --- | --- | --- |
| 1 | 1 | non-tacky | A | 52 | A | B | A | 150 | 5 |
| 2 | 2 | non-tacky | A | 30 | A | A | A | 150 | 2 |
| 3 | 3 | non-tacky | A | 35 | A | B | A | 150 | 3 |
| 4 | 4 | non-tacky | A | 40 | A | B | A | 150 | 4 |
| 5 | 5 | non-tacky | A | 25 | A | A | A | 150 | 1 |

(1) A : none of pinholes and radiate unevenness B : 1 to 20 pinholes per m² but none of radiate unevenness. C : more than 20 pinholes per m² and radiate unevenness (2) minimum exposure time (sec.) for obtaining appropriate and strong image relief (3) time for treating an exposed plate with a one percent sodium carbonate solution A : <3 minutes B : 3 to 10 minutes C : >10 minutes, i.e.,substantially impossible to develop (4) after a presensitized plate is immersed in methylethyl ketone at 20°C. for 24 hours and then dried to obtain a constant weight, a reduction of weight is measured. A : <5 percent B : 5 to 10 percent C : >10 percent (5) A : laquering is unnecessary. B : laquering is necessary.

(6) range : from high light 2.5 percent to shadow 97.5 percent

PREPARATION OF LITHOGRAPHIC PLATES

EXAMPLES 1 to 5

250 Parts of each polymer solution of Syntheses 1 to 5 were diluted with a mixture of 1050 parts of 1-butanol, 180 parts of benzene and 180 parts of ethyl acetate, and to the mixture there were added 25 parts of tetramethylolmethane tetramethacrylate, 0.9 part of 1,2-benzanthraquinone and 0.1 part of benzoin methylether and sufficiently mixed to give a solution of photopolymerizable composition. A turbo-grained aluminium plate, 0.2 mm. thick, was coated with such resulting solution by a whirler at a rotating rate of 50 r.p.m. to produce a presensitized plate and the plate was dried at 20°C. for 16 hours. The thickness of the layer of photopolymerizable composition was 3 microns. The

EXAMPLES 6 to 10

250 Parts of each polymer solution of Syntheses 5 to 8 were diluted with a mixture of 1050 parts of 1-butanol, 180 parts of benzene and 180 parts of ethyl acetate and to the mixture there were added ethylenically unsaturated monomers and photopolymerization initiators set forth in Table 5 and sufficiently mixed to produce a solution of photopolymerizable composition. Using each resulting solution a lithographic plate for offset printing was prepared in the same manner as in Examples 1 to 5. The thickness of the layer of photopolymerizable composition was 3 micron. Then an offset printing was carried out by a sheet-fed press to give clear and precise impressions. The results are shown in Table 5.

Table 5

| Ex. No. | Polymer synthesis No. | Ethylenically unsaturated monomers (parts)(7) | Photopolymerization initiator (parts)(7) | Tackiness of photosensitive layer at 20°C. | Film performance of photosensitive layer(1) | Photosensitivity (exposure time) (sec.)(2) | Developing time (min.)(3) | Resistance to solvent (4) | Inking(5) | Resolving power(6) (line/inch) | Resistance to printing (No. of impressions) |
| --- | --- | --- | --- | --- | --- | --- | --- | --- | --- | --- | --- |
| 6 | 5 | acrylamide 35 triethyleneglycol dimethacrylate 5 | 1,2-benzanthraquinone 0.9 benzoin ethyl ether 0.1 | non-tacky | A | 22 | A | A | A | 150 | >100,000 |
| 7 | 5 | acrylamide 10 tetramethylolmethane tetramethacrylate 25 | 1-chloroanthraquinone 0.5 benzoin methyl ether 0.2 | non-tacky | A | 27 | A | A | A | 150 | >100,000 |
| 8 | 6 | tetramethylolmethane tetramethacrylate 25 triethylene- | 1,2-benzanthraquinone 0.8 benzoin methyl ether 0.2 | non-tacky | A | 24 | A | A | A | 150 | >100,000 |

Table 5-continued

| Ex. No. | Polymer synthesis No. | Ethylenically unsaturated monomers (parts)(7) | Photo-polymerization initiator (parts)(7) | Tackiness of photo-sensitive layer at 20°C. | Film performance of photo-sensitive layer(1) | Photosensitivity (exposure time) (sec.)(2) | Developing time (min.)(3) | Resistance to solvent (4) | Inking(5) | Resolving power(6) (line/inch) | Resistance to printing (No. of impressions) |
|---|---|---|---|---|---|---|---|---|---|---|---|
| 9 | 7 | glycol dimethacrylate 5 acrylamide 35 triethyleneglycol dimethacrylate 5 | 1-chloroanthraquinone 0.8 benzoin ethyl ether 0.2 | non-tacky | A | 22 | A | A | A | 150 | >100,000 |
| 10 | 8 | acrylamide 40 | 1-chloroanthraquinone 0.8 benzoin ethyl ether 0.2 | non-tacky | A | 30 | A | A | A | 150 | >100,000 |

Note: (1), (2), (3), (4), (5) and (6) are the same as defined in Table 4. (7) parts per 100 parts of the addition polymerizable polymeric compound.

EXAMPLES 11 to 14 and COMPARATIVE EXAMPLES 1 to 4

250 Parts of each polymer solutions of Syntheses 9 to 16 were diluted with a mixture of 1050 parts of 1-butanol 180 parts of benzene and 180 parts of ethyl acetate and to the mixture there were added ethylenically unsaturated monomers and photopolymerization initiators set forth in Table 6 and sufficiently mixed to prepare a solution of photopolymerizable composition. But the concentration of the polymer solutions of Syntheses 13 and 15 was low and therefore the amount of the mixture solvent to be added was reduced to finally obtain the same concentration. Subsequently examples of 1 to 5 was repeated to obtain a lithographic printing plate. The thickness of the layer of photopolymerizable composition was 2.5 microns. Using this plate an offset printing was carried out by a sheet-fed press. The results are shoen in Table 6.

Table 6

| Example No. | Polymer synthesis No. | Ethylenically polymeri-unsaturated monomers (parts)(7) | Photo-polymerization initiator (parts)(7) | Tackiness of photo-sensitive layer at 20°C. | Film performance of photo-sensitive layer (1) | Photosensitivity (exposure time) (sec.)(2) | Developing time (min.)(3) | Resistance to solvent (4) | Inking (5) | Resolving power(6) (line/inch) | Others |
|---|---|---|---|---|---|---|---|---|---|---|---|
| Comparative example 1 | 9 | acrylamide 30 tetraethyleneglycol dimethacrylate 10 | 1-chloroanthraquinone 2 | non-tacky | B | 25 | A | A | B | 150 | |
| Comparative example 2 | 10 | tetramethylolmethane tetramethacrylate 20 acrylamide 10 | 1,2-benzanthraquinone 1 1-chloroanthraquinone 1 | non-tacky | A | >200 | C | C | A | — | |
| 11 | 11 | tetraethyleneglycol dimethacrylate 10 tetramethylolmethane tetramethacrylate 20 | 2-ethylanthraquinone 2 | non-tacky | A | 25 | A | B | A | 150 | |
| 12 | 12 | " | " | non-tacky | A | 20 | A | A | A | 150 | |
| Comparative example 3 | 13 | tetraethyleneglycol dimethacrylate 10 acrylamide 10 | 1-chloroanthraquinone 2 | slightly tacky | B | 25 | A | A | B | 150 | very hygroscopic |
| 13 | 14 | acrylamide 10 tetraethyleneglycol dimethacrylate 20 | 1,2-benzanthraquinone 1 1-chloroanthraquinine 1 | non-tacky | A | 22 | A | A | A | 150 | |
| Comparative example 4 | 15 | " | " | non-tacky | C | 25 | C | A | B | — | |
| 14 | 16 | tetramethylolmethane tetramethacrylate 20 triethyleneglycol dimethacrylate 10 | 2-ethylanthraquinone 2 | non-tacky | A | 25 | A | B | B | 150 | |

Note: (1), (2), (3), (4), (5) and (6) are the same as defined in Table 4. (7) parts per 100 parts of the addition polymerizable polymeric compound.

EXAMPLES 15 to 29 and
COMPARATIVE EXAMPLES 5 to 6

250 Parts of each polymer solution of Synthesis 17 to 33 were diluted with a mixture of 1050 parts of 1-butanol, 180 parts of benzene and 180 parts of ethyl acetate and to the resulting mixture there were added ethylenically unsaturated monomers and photopolymerization initiator set forth in Table 7 and sufficiently mixed to produce a solution of photopolymerizable composition. Using each resulting solution a lithographic plate for offset printing was prepared in the same manner as in Examples 1 to 5. The thickness of the layer of photopolymerizable composition was 3 microns. Then an offset printing was carried out by a sheet-fed press to give clear and precise impressions. The results are shown in Table 7.

Table 7

| Example No. | Polymer synthesis No. | Ethylenically unsaturated monomers (parts)(7) | Photo-polymerization initiator (parts)(7) | Tackiness of photo-sensitive layer at 20°C. | Film performance of photo-sensitive layer(1) | Photosensitivity (exposure time) (sec.)(2) | Developing time (min.(3) | Resistance to solvent (4) | Inking (5) | Resolving power(6) (line/inch) |
|---|---|---|---|---|---|---|---|---|---|---|
| 15 | 17 | triethyleneglycol dimethacrylate 30 N-methylol acrylamide 15 | 1-methyl anthraquinone 3 | non-tacky | A | 25 | A | A | A | 150 |
| 16 | 18 | tetramethylolmethane tetramethacrylate 25 | 1,2-benzanthrequinone 1 benzoin methyl ether 1 | non-tacky | A | 30 | A | A | A | 150 |
| 17 | 19 | methylenebis-acrylamide 30 | 1-chloroanthraquinone 2 | non-tacky | A | 28 | A | A | A | 150 |
| 18 | 20 | acrylamide 35 triethyleneglycol dimethacrylate 10 | alpha-methyl benzoin 1 2-ethylanthraquinone 2 | non-tacky | A | 25 | A | A | A | 150 |
| 19 | 21 | tetramethyleneglycol dimethacrylate 40 methacrylamide 10 | 1-chloroanthraquinone 2 benzoin 1 | non-tacky | A | 20 | A | A | A | 150 |
| 20 | 22 | N,N-dimethylacrylamide 10 triethyleneglycol dimethacrylate 30 | 2-ethyl-anthraquinone 3 | non-tacky | A | 25 | A | A | A | 150 |
| 21 | 23 | tetramethylolmethane tetra methacrylate 20 acrylamide 10 | 1,2-benzanthaquinone 1 1-chloroanthraquinone 1 | non-tacky | A | 25 | A | A | A | 150 |
| 22 | 24 | triethyleneglycol dimethacrylate 10 tetramethylolmethane tetramethacrylate 20 | 2-ethyl-anthraquinone 2 | non-tacky | A | 20 | A | A | A | 150 |
| 23 | 25 | '' | '' | non-tacky | A | 25 | A | A | A | 150 |
| 24 | 26 | N-ethylol acrylamide 30 tetraethylene glycol dimethacrylate 20 | 1-chloroanthraquinone 3 benzoin 1 | non-tacky | A | 28 | A | A | A | 150 |
| 25 | 27 | N-methylolacrylamide 10 tetramethylolmethane tetramethacrylate 20 | 2-ethylanthraquinone 3 | non-tacky | A | 25 | A | A | A | 150 |
| 26 | 28 | '' | '' | non-tacky | A | 25 | A | A | A | 150 |
| 27 | 29 | hexamethyleneglycol dimethacrylate 30 methylenebis-acrylamide 10 | anthraquinone 3 benzoin 2 | non-tacky | A | 40 | A | A | A | 150 |
| 28 | 30 | N-hexylacrylamide 30 triethyleneglycol dimethacrylate 10 | 1-chloroanthraquinone 3 | non-tacky | A | 30 | A | A | A | 150 |
| 29 | 30 | '' | '' | non-tacky | A | 30 | A | A | A | 150 |
| Comparative example 5 | 32 | tetraethyleneglycol dimethacrylate 10 N-methylolacrylamide | 2-ethyl-anthraquinone 2 | non-tacky | B | 25 | A | A | C | 150 |

Table 7-continued

| Example No. | Polymer synthesis No. | Ethylenically unsaturated monomers (parts)(7) | Photo-polymer-ization initiator (parts)(7) | Tackiness of photo-sensitive layer at 20°C. | Film performance of photo-sensitive layer(1) | Photosensitivity (exposure time) (sec.)(2) | Developing time (min.(3) | Resistance to solvent (4) | Inking (5) | Resolving power(6) (line/inch) |
|---|---|---|---|---|---|---|---|---|---|---|
| Comparative example 6 | 33 | 20 " | " | non-tacky | B | 25 | A | A | C | 150 |

Note: (1), (2), (3), (4), (5) and (6) are the same as defined in Table 4. (7) parts per 100 parts of the addition polymerizable polymeric compound

EXAMPLE 30

A laminate support was prepared by passing between two rollers an aluminum foil of 30 microns in thickness which one surface was grained with a brush and a polyester film of 40 microns which one surface was coated with a urethane-type adhesive. The laminated support was coated with an 8 percent ethyl acetate solution of 100 parts of the addition polymerizable polymeric compound of Synthesis 5, 40 parts of tetraethyleneglycol diacrylate and 2 parts of 4,4'-dimethylamino benzophenone by a gravure coater and dried to produce a presensitized plate. The thickness of the layer of photopolymerizable composition was 3 microns. The plate was placed in a vacuum frame and exposed to a high pressure mercury lamp through a negative having a resolving power of 175 lines per inch for 30 seconds. After washing off the non-exposed portions with a one percent sodium carbonate and then with water there was obtained a lithographic plate for offset printing. Using the plate an offset printing was carried out by a sheet-fed press at a printing rate of 4,000 impressions per minute. After 50,000 impressions there was not observed any irregularity in the reproducibility of dots in the high light portion having 5 percent dots.

What is claimed is:

1. In addition polymerizable polymeric compound obtained by esterification reaction of a copolymer having pendent carboxyl groups with about 0.10 to 0.8 equivalent, based upon the carboxyl groups of said copolymer, of an ethylenically unsaturated compound having one oxirane ring, said copolymer being obtained by copolymerizing (1) about 10 to 95 percent by weight of at least one member selected from the group consisting of styrene and the methyl-substituted styrene derivatives, (2) about 5 to 70 percent by weight of at least one ethylenically unsaturated compound selected from the group consisting of a monocarboxylic acid, a dicarboxylic acid, a dicarboxylic acid anhydride and a monoalkyl ester of a dicarboxylic acid wherein the alkyl group contains from 1 to 4 carbon atoms, (3) up to about 30 percent weight of at least one member selected from the group consisting of acrylonitrile and methacrylonitrile, (4) up to about 85 percent by weight of at least one compound of the formula

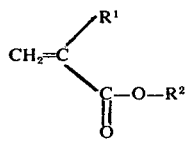

wherein $R^1$ represents a hydrogen atom or methyl group; and $R^2$ represents an alkyl group having 1 to 12 carbon atoms, and (5) up to about 50 percent by weight, based upon the total weight of said compound (3) and/or (4), of at least one vinyl ester of a saturated aliphatic nono-carboxylic acid having 2 to 10 carbon atoms.

2. An addition polymerizable polymeric compound as claimed in claim 1 wherein said ethylenically unsaturated compound having one oxirane ring comprises one compound selected from the group consisting of glycidyl acrylate, glycidyl methacrylate, glycidyl alpha-ethyl acrylate and allylglycidyl ether.

3. An addition polymerizable polymeric compound as claimed in claim 3 wherein said ethylenically unsaturated compound having one oxirane ring is glycidyl methacrylate.

4. An addition polymerizable polymeric compound as claimed in claim 3 wherein said ethylenically unsaturated compound having one oxirane ring is glycidyl acrylate.

5. An addition polymerizable polymeric compound as claimed in claim 1 wherein said copolymer is selected from the group consisting of styrene / acrylic acid copolymer, sytrene / acrylic acid / acrylonitrile copolymer, styrene / acrylic acid / acrylonitrile / n-butyl acrylate copolymer, styrene / methacrylic acid copolymer, styrene / acrylic acid / n-butyl acrylate copolymer, styrene / acrylic acid / methacrylonitrile copolymer, sytrene / acrylic acid / n-butyl acrylate / vinyl acetate copolymer, styrene / methacrylic acid / acrylonitrile / ethyl acrylate copolymer, styrene / acrylic acid / acrylonitrile / ethyl acrylate copolymer, styrene / acrylic acid / acrylonitrile / methacrylonitrile copolymer, styrene / acrylic acid / acrylonitrile / n-butyl acrylate / methyl acrylate copolymer, styrene / acrylic acid / acrylonitrile / n-octyl acrylate copolymer, styrene / acrylic acid / methyl methacrylate / n-butyl acrylate copolymer, alpha-methyl styrene / acrylic acid copolymer, vinyl toluene / acrylic acid / acrylonitrile copolymer, styrene / itaconic acid / n-butyl acrylate copolymer, styrene / monoethyl maleate / acrylonitrile / n-butyl acrylate copolymer, styrene / methacrylic acid / acrylonitrile / lauryl acrylate copolymer, styrene / acrylic acid / acrylonitrile / methacrylonitrile copolymer, styrene / methacrylic acid / n-butyl acrylate copolymer, styrene / methacrylic acid / methacrylonitrile / ethyl acrylate copolymer, styrene / methacrylic acid / acrylonitrile copolymer, styrene / acrylic acid / acrylonitrile / 2-ethylhexyl acrylate copolymer and styrene / methacrylic acid / acrylonitrile / 2-ethylhexyl acrylate.

6. An addition polymerizable polymeric compound as claimed in claim 5 wherein said polymer is a styrene / acrylic acid copolymer.

7. An addition polymerizable polymeric compound as claimed in claim 5 wherein said copolymer is a styrene / acrylic acid / acrylonitrile copolymer.

8. An addition polymerizable polymeric compound as claimed in claim 5 wherein said copolymer is a styrene / acrylic acid / acrylonitrile / n-butyl acrylate copolymer.

* * * * *